(12) United States Patent
Loscutoff et al.

(10) Patent No.: US 9,142,696 B2
(45) Date of Patent: Sep. 22, 2015

(54) SOLAR CELLS WITH SILICON NANOPARTICLES THAT ARE COATED WITH NANOPARTICLE PASSIVATION FILM

(71) Applicant: SunPower Corporation, San Jose, CA (US)

(72) Inventors: Paul Loscutoff, Castro Valley, CA (US); Steven Molesa, San Jose, CA (US); Taeseok Kim, Pleasanton, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/460,624

(22) Filed: Aug. 15, 2014

(65) Prior Publication Data

US 2014/0352781 A1 Dec. 4, 2014

Related U.S. Application Data

(63) Continuation of application No. 13/335,550, filed on Dec. 22, 2011, now Pat. No. 8,822,262.

(51) Int. Cl.
| | |
|---|---|
| *H01L 35/24* | (2006.01) |
| *H01L 51/00* | (2006.01) |
| *H01L 31/0216* | (2014.01) |
| *H01L 31/18* | (2006.01) |
| *H01L 31/0384* | (2006.01) |
| *H01L 31/0224* | (2006.01) |
| *H01L 31/0368* | (2006.01) |
| *B82Y 30/00* | (2011.01) |

(52) U.S. Cl.
CPC .. *H01L 31/02167* (2013.01); *H01L 31/022458* (2013.01); *H01L 31/03682* (2013.01); *H01L 31/03845* (2013.01); *H01L 31/18* (2013.01); *B82Y 30/00* (2013.01)

(58) Field of Classification Search
CPC ..... H01L 35/24; H01L 51/00; H01L 31/0224; H01L 31/18
USPC .......................... 257/40, E31.124; 438/57, 98
See application file for complete search history.

(56) References Cited

U.S. PATENT DOCUMENTS

| | | | | |
|---|---|---|---|---|
| 2009/0288704 | A1* | 11/2009 | Borden | 136/255 |
| 2011/0032743 | A1* | 2/2011 | Huang et al. | 365/112 |
| 2013/0045562 | A1* | 2/2013 | Liu et al. | 438/72 |
| 2013/0164879 | A1* | 6/2013 | Cousins et al. | 438/71 |

* cited by examiner

*Primary Examiner* — Phuc Dang
(74) *Attorney, Agent, or Firm* — Okamoto & Benedicto LLP

(57) ABSTRACT

A laser contact process is employed to form contact holes to emitters of a solar cell. Doped silicon nanoparticles are formed over a substrate of the solar cell. The surface of individual or clusters of silicon nanoparticles is coated with a nanoparticle passivation film. Contact holes to emitters of the solar cell are formed by impinging a laser beam on the passivated silicon nanoparticles. For example, the laser contact process may be a laser ablation process. In that case, the emitters may be formed by diffusing dopants from the silicon nanoparticles prior to forming the contact holes to the emitters. As another example, the laser contact process may be a laser melting process whereby portions of the silicon nanoparticles are melted to form the emitters and contact holes to the emitters.

20 Claims, 6 Drawing Sheets

SOLAR CELLS WITH SILICON NANOPARTICLES THAT ARE COATED WITH NANOPARTICLE PASSIVATION FILM

CROSS-REFERENCE TO RELATED APPLICATION

This application is a continuation of U.S. application Ser. No. 13/335,550, filed on Dec. 22, 2011, now U.S. Pat. No. 8,822,262, which is incorporated herein by reference in its entirety.

TECHNICAL FIELD

Embodiments of the subject matter described herein relate generally to solar cells. More particularly, embodiments of the subject matter relate to apparatus, processes, and structures for fabricating solar cells.

BACKGROUND

Solar cells are well known devices for converting solar radiation to electrical energy. A solar cell includes P-type and N-type diffusion regions, which are also referred to as "emitters." During fabrication, a contact process is performed to form contact holes to the emitters. Metal contacts are formed in the contact holes to electrically connect to corresponding emitters. The metal contacts allow an external electrical circuit to be coupled to and be powered by the solar cell.

The contact process forms contact holes through layers of materials to expose the emitters. The contact process must not interfere with particular structures or layers of materials already in place, and must not damage the emitters in a way that decreases electrical performance. Because the contact process involves penetrating through many layers of materials on top of the emitters, it is a process with inherently high risk of damaging the solar cell.

BRIEF SUMMARY

In one embodiment, a method of forming contact holes of solar cells includes forming doped silicon nanoparticles over a solar cell substrate. The doped silicon nanoparticles are coated with a nanoparticle passivation film. A laser beam is impinged on the doped silicon nanoparticles in a laser contact process to form a contact hole through the doped silicon nanoparticles to an emitter of the solar cell.

In another embodiment, a solar cell comprises a solar cell substrate, a plurality of doped silicon nanoparticles over the solar cell substrate, a surface of individual or clusters of the plurality of doped silicon nanoparticles having a nanoparticle passivation film, a contact hole through the plurality of doped silicon nanoparticles, an emitter, and a metal contact electrically connecting to the emitter through the contact hole.

In another embodiment, a method of forming contact holes of solar cells involves forming doped silicon nanoparticles over a solar cell substrate. Dopants from the doped silicon nanoparticles are diffused to form an emitter. The doped silicon nanoparticles are coated with a nanoparticle passivation film. A laser beam is impinged on the doped silicon nanoparticles in a laser contact process to form a contact hole through the doped silicon nanoparticles to the emitter.

In another embodiment, a method of forming contact holes of solar cells includes forming doped silicon nanoparticles over a substrate of a solar cell. The doped silicon nanoparticles are coated with a nanoparticle passivation film. Portions of the doped silicon nanoparticles are melted with a laser beam to form an emitter of the solar cell with the melted portions of the doped silicon nanoparticles and to form a contact hole to the emitter of the solar cell.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The drawings are not to scale.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
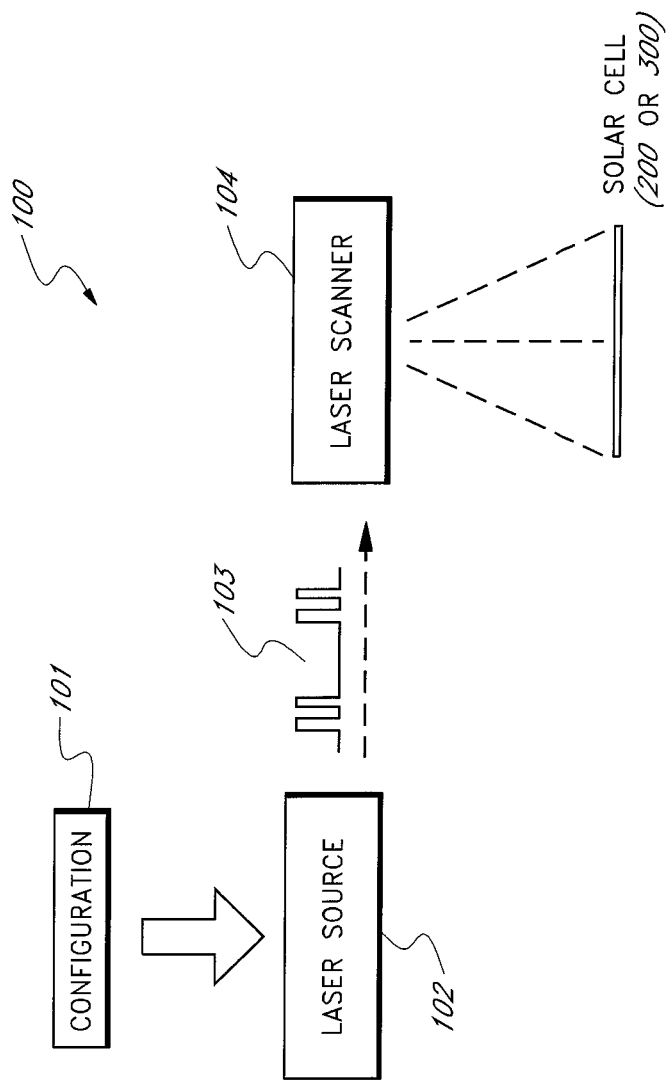
FIG. 1 schematically illustrates a solar cell laser system in accordance with an embodiment of the present invention.

FIG. 1 schematically illustrates a solar cell laser system 100 in accordance with an embodiment of the present invention. In the example of FIG. 1, the laser system 100 includes a laser source 102 and a laser scanner 104. The laser source 102 may be a commercially available laser source. The laser scanner 104 may comprise a galvanometer laser scanner. In operation, the laser source 102 generates a laser beam 103 at a predetermined wavelength, in accordance with a configuration 101. The configuration 101 may comprise switch/knob arrangements, computer-readable program code, software interface settings, and/or other ways of setting the configurable parameters of the laser source 102. The configuration 101 may set the pulse repetition rate, number of pulses fired per repetition, pulse shape, pulse amplitude, pulse intensity or energy, and other parameters of the laser source 102. The laser scanner 104 scans the laser pulses 103 across a solar cell being fabricated to form contact holes therein. The solar cell of FIG. 1 may be the solar cell 200 of FIGS. 2-7 or the solar cell 300 of FIGS. 8-12, for example.

FIGS. 2-7 show cross sections schematically illustrating a method of forming contact holes of a solar cell 200 by laser ablation of silicon nanoparticles in accordance with an embodiment of the present invention.

Figure 2:
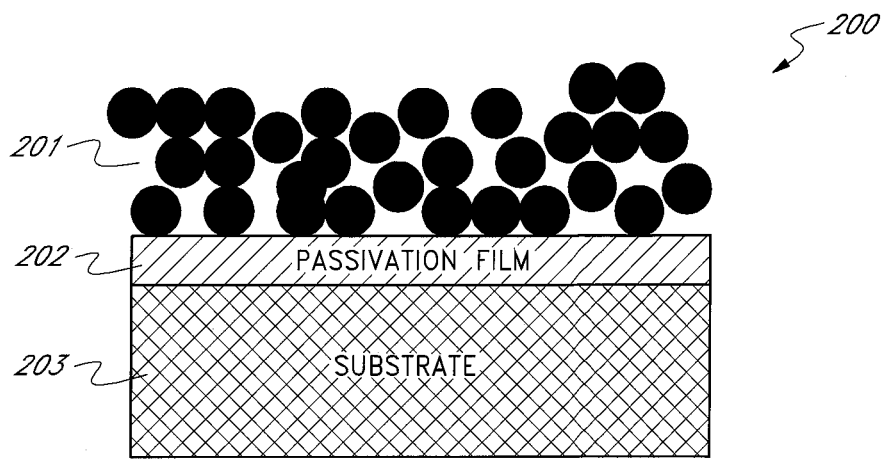
FIGS. 2-7 show cross sections schematically illustrating a method of forming contact holes of a solar cell by laser ablation of silicon nanoparticles in accordance with an embodiment of the present invention.

In FIG. 2, the solar cell substrate comprises a crystalline silicon substrate 203. The surface of the of the silicon substrate 203 may be passivated prior to formation of the nanoparticles 201 on the silicon substrate 203. The surface of the silicon substrate 203 may be passivated by forming a continuous interface to the nanoparticles 201 or by doping the substrate interface to repel minority carriers. The nanoparticles 201 may also serve as a passivation layer. In the example of FIG. 2, the surface of the silicon substrate 203 is passivated by a passivation film 202. The passivation film 202 may comprise silicon dioxide. As a particular example, the passivation film 202 may comprise silicon dioxide thermally grown or deposited on the surface of the silicon substrate 203. In general, the passivation film 202 may comprise any suitable passivation material, such as an oxide, for example. The passivation film 202 may also be optional depending on the specifics of the solar cell.

In one embodiment, the nanoparticles 201 comprise doped silicon nanoparticles having a particle size less than 500 nm. The silicon nanoparticles 201 may be doped with an N-type dopant (e.g., phosphorus) to form an N-type emitter or with a P-type dopant (e.g., boron) to form a P-type emitter. As will be more apparent below, the silicon nanoparticles 201 may serve as a dopant source for forming an emitter (see FIG. 3).

Emitters formed using silicon nanoparticles allow for relatively high minority carrier lifetimes (>1 ms), improving the efficiency of the solar cell. However, use of silicon nanoparticles as a dopant source or as a substitute for a polysilicon emitter in solar cells is not a mature technology and forming contact holes through silicon nanoparticles is heretofore not a well-known process.

In the example of FIG. 2, the silicon nanoparticles 201 are formed on the passivation film 202. The silicon nanoparticles 201 may be formed by a printing process, such as by screen printing or inkjet printing, for example. The passivation film 202 is an optional feature that may or may not be applicable depending on the specifics of the solar cell. For example, the silicon nanoparticles 201 may be formed directly on the surface of the substrate 203.

Figure 3:
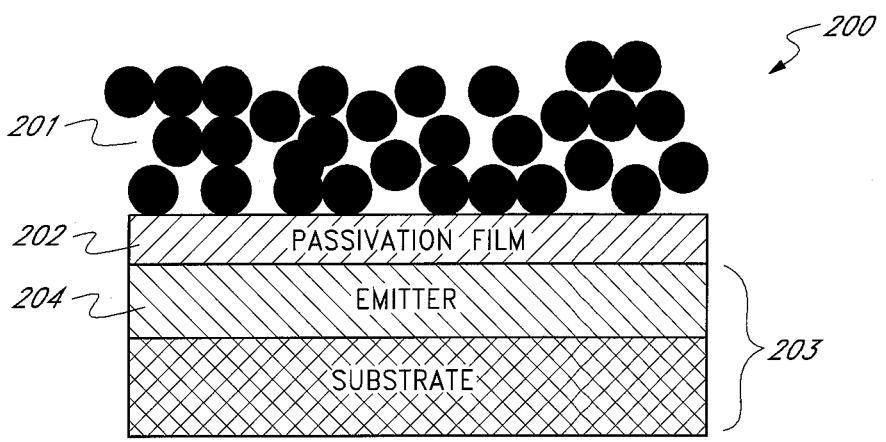

In FIG. 3, dopants from the silicon nanoparticles 201 are diffused through the passivation film 202 and into the silicon substrate 203 to form the emitter 204 in the silicon substrate 203. The diffusion process to form the emitter 204 may comprise a heating step performed in a furnace, for example. The solar cell 200 includes a plurality of emitters with different conductivity types but only one is shown in FIG. 3 and subsequent figures for clarity of illustration. The emitter 204 may have P-type conductivity, in which case the silicon nanoparticles 201 comprise P-type dopants. Alternatively, the emitter 204 may have N-type conductivity, in which case the silicon nanoparticles 201 comprise N-type dopants. In general, silicon nanoparticles 201 with P-type dopants are formed over regions of the substrate 203 where P-type emitters are formed, and silicon nanoparticles 201 with N-type dopants are formed over regions of the substrate 203 where N-type emitters are formed. The diffusion process diffuses dopants from the silicon nanoparticles 201 into the silicon substrate 203 to form emitters 204 with corresponding conductivity type.

Figure 4:
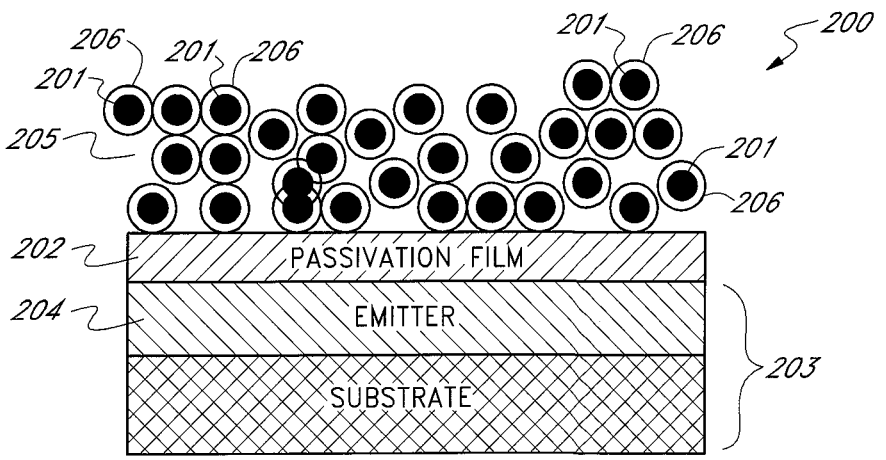

In FIG. 4, the silicon nanoparticles 201 are passivated to minimize recombination of electron-hole pairs and to optimize the laser ablation process. The silicon nanoparticles 201 are relabeled as passivated silicon nanoparticles 205 to indicate that the passivation process coats individual or clusters of fused or agglomerated silicon nanoparticles 201 with a nanoparticle passivation film 206. The nanoparticle passivation film 206 may comprise silicon dioxide, silicon nitride, or other suitable passivation material formed on the surface of individual or clusters of silicon nanoparticles 201. For example, the nanoparticle passivation film 206 may comprise an oxide thermally grown on the surface of the silicon nanoparticles 201 by heating the silicon nanoparticles 201 in an oxidizing environment. Depending on the porosity of the silicon nanoparticles 201, the nanoparticle passivation film 206 may also be deposited on the surface of the silicon nanoparticles 201 by chemical vapor deposition (CVD), including by atomic layer deposition (ALD). For example, the nanoparticle passivation film 206 may comprise silicon nitride deposited on the surface of the silicon nanoparticles 201 by ALD.

In the example of FIG. 4, the silicon nanoparticles 201 are passivated after the diffusion process that formed the emitter 204. Because, dopants from the silicon nanoparticles 201 may diffuse through the nanoparticle passivation film 206, the silicon nanoparticles 201 may also be passivated before the diffusion process that forms the emitter 204. Passivating the silicon nanoparticles 201 before the diffusion process may prevent a scenario where the silicon nanoparticles 201 would coalesce during the diffusion process. On the other hand, passivating the silicon nanoparticles 201 before the diffusion process may inhibit the diffusion process on some applications. The order in which the diffusion and silicon nanoparticle passivation processes are performed will depend on the particulars of the overall fabrication process. In general, the nanoparticle passivation film 206 may be grown or deposited on the surface of individual or clusters of silicon nanoparticles 201 during synthesis (i.e., creation of the silicon nanoparticles 201), after synthesis but before formation of the silicon nanoparticles 201 on the substrate 203, or after formation of the silicon nanoparticles 201 on the substrate 203 as in FIG. 4.

Figure 5:
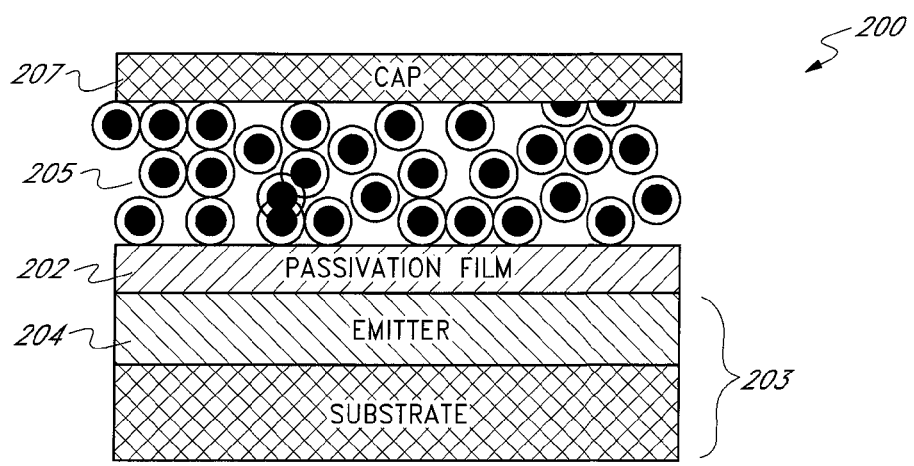

In FIG. 5, a cap layer 207 is formed on the passivated silicon nanoparticles 205. The cap layer 207 may comprise deposited silicon nitride or other capping material. The cap layer 207 prevents moisture from seeping into underlying materials, possibly degrading the interface of the passivated silicon nanoparticles 205 and the passivation film 202. The cap layer 207 also advantageously prevents dopants from escaping into the process chamber in processes where the emitter 204 is formed after the cap layer 207 is formed. In particular, the diffusion step to drive dopants from the silicon nanoparticles 201 to the substrate 203 may be performed after the cap layer 207 has been formed. In that case, the cap layer 207 prevents dopants from escaping into the process chamber and diffusing into other features of the solar cell 200. The cap layer 207 is optional and may be omitted in some processes.

Figure 6:
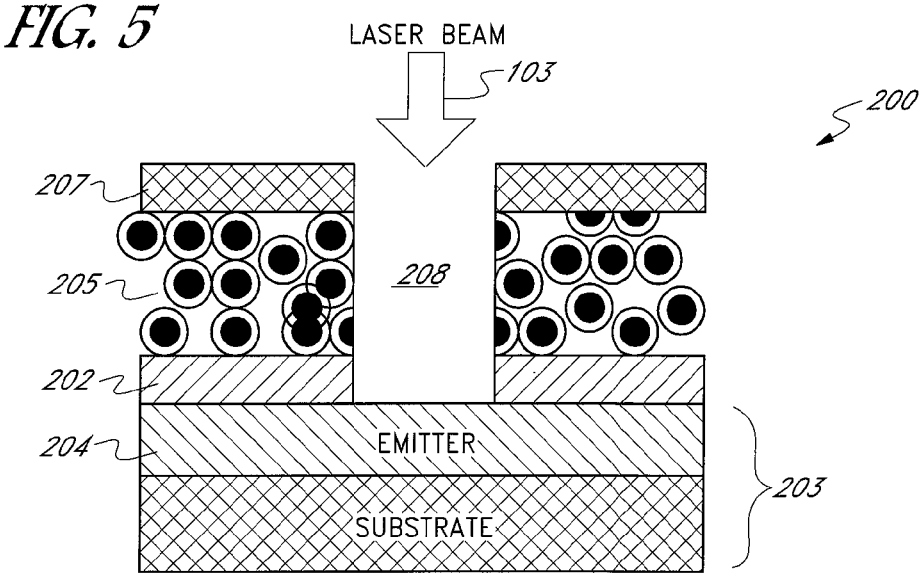

In FIG. 6, a laser contact process impinges the laser beam 103 on materials formed on the emitter 204 to form the contact hole 208 and expose the emitter 204. Only one contact hole 208 is shown for clarity of illustration. The solar cell 200 includes a plurality of emitters 204 and a contact hole 208 may be formed to each of the emitters 204.

In the example of FIG. 6, the laser contact process comprises a laser ablation process to form contact holes through silicon nanoparticles. In general, the laser contact process may involve one or more laser sources, one or more laser pulses, one or more laser steps, and may include laser processes other than ablation. The laser contact process may involve having the laser beam 103 remove portions of the cap layer 207, passivated silicon nanoparticles 205, and passivation film 202 to form the contact hole 208 and expose the emitter 204. In one embodiment, the removal of portions of the passivated silicon nanoparticles 205 to form the contact hole 208 therethrough is by laser ablation. The removal of portions of the cap layer 207 and passivation film 202 may be by laser ablation, but may also be by other laser processes in separate laser steps.

In the case of laser ablation, the thickness of the nanoparticle passivation film 206 may cover a wide range relative to the particle size of the silicon nanoparticles 201, but is generally going to be thicker compared to, for example, a laser melting process. The laser source 102 is selected with optimal power, wavelength, and pulse time to achieve nanoparticle ablation. These laser characteristics may differ from those in the case of bulk silicon because of the size dependence of physical properties for nanoparticles, including optical and thermal behavior. The laser beam 103 of the laser source 102 may be directed onto the area where the contact hole 208 is to be formed. That area may be any size less than or equal to the area covered by the passivated silicon nanoparticles 205.

The thickness of the nanoparticle passivation film 206 relative to the particle size of the silicon nanoparticles 201 may be tailored for a particular laser source 102. For example, because silicon absorbs green laser and oxide is transparent to green laser, the thickness of an oxide (e.g., silicon dioxide, titanium oxide, aluminum oxide, hafnium oxide) nanoparticle passivation film 206 may be adjusted to predominantly transmit or absorb a laser beam 103 in the green wavelength. That is, the thickness of the nanoparticle passivation film 206 may be adjusted for optimum ablation. The thickness of the nanoparticle passivation film 206, the particle size of the silicon nanoparticles 201, and the characteristics of the laser source 102 will depend on the particulars of the solar cell.

The individual nanoparticles passivation film 206 acts as an insulator, creating discrete ablation events at the silicon nanoparticles 201. This results in the possibility for direct ablation of the silicon nanoparticles 201 and minimal damage to the emitter 204 and the substrate 203, opening the contact hole 208 to the surface of the emitter 204. The contact hole 208 is only opened where the silicon nanoparticles 201 were exposed to the laser beam 103, while the rest of the silicon nanoparticles 201 remain. These remaining silicon nanoparticles 201 have a higher resistivity, and will not conduct charge carriers or contribute significantly to carrier recombination.

Figure 7:
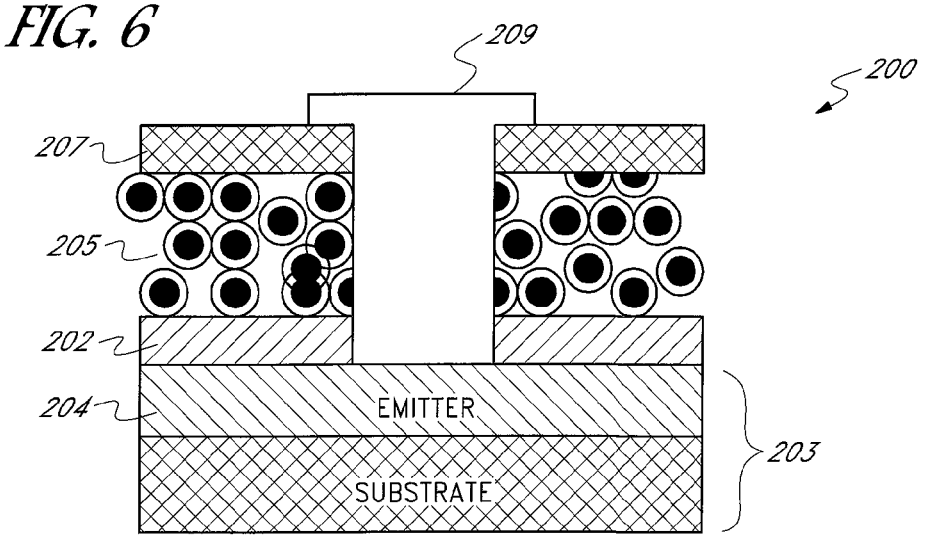

In FIG. 7, a metal contact 209 is formed in each contact hole 208 to electrically connect to a surface of a corresponding emitter 204.

FIGS. 8-12 show cross sections schematically illustrating a method of forming contact holes of a solar cell 300 by laser melting silicon nanoparticles in accordance with an embodiment of the present invention. Laser melting includes laser processes that involve annealing, sintering, coalescing, or raising the temperature of the particles to cause the particles to conglomerate. In general, laser melting involves laser pulses with relatively long pulse widths, e.g., one nano second and longer. In marked contrast, laser ablation involves laser pulses with relatively shorter pulse widths, which may be one pico second and shorter.

Figure 8:
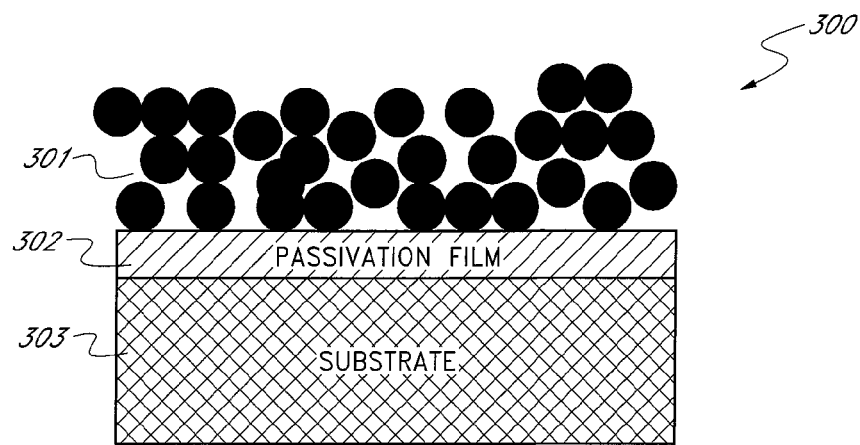
FIGS. 8-12 show cross sections schematically illustrating a method of forming contact holes of a solar cell by laser melting silicon nanoparticles in accordance with an embodiment of the present invention.

In FIG. 8, the solar cell substrate comprises a crystalline silicon substrate 303. The surface of the silicon substrate 303 may be passivated prior to formation of the nanoparticles 301 on the silicon substrate 303. The surface of the silicon substrate 303 may be passivated by forming a continuous interface to the nanoparticles 301 or by doping the substrate interface to repel minority carriers. The nanoparticles 301 may also serve as a passivation layer. In the example of FIG. 8, the surface of the silicon substrate 303 is passivated by a passivation film 302. The passivation film 302 may comprise silicon dioxide. As a particular example, the passivation film 302 may comprise silicon dioxide thermally grown or deposited on the surface of the silicon substrate 303. In general, the passivation film 302 may comprise any suitable passivation material, such as an oxide, for example. The passivation film 302 may also be optional depending on the specifics of the solar cell. For example, the silicon nanoparticles 301 may be formed directly on the surface of the substrate 303.

In one embodiment, the nanoparticles 301 comprise doped silicon nanoparticles having a particle size less than 500 nm. The silicon nanoparticles 301 may be doped with an N-type dopant (e.g., phosphorus) to form an N-type emitter or with a P-type dopant (e.g., boron) to form a P-type emitter. The silicon nanoparticles 301 are formed on the passivation film 302. The silicon nanoparticles 301 may be formed by a printing process, such as by screen printing or inkjet printing, for example.

Figure 9:
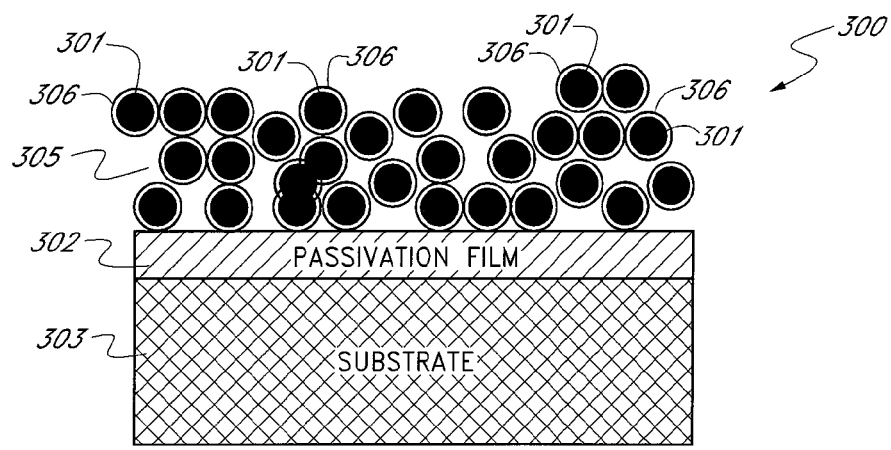

In FIG. 9, the silicon nanoparticles 301 are passivated to minimize recombination of electron-hole pairs and to optimize the laser melting process. The silicon nanoparticles 301 are relabeled as passivated silicon nanoparticles 305 to indicate that the passivation process coats individual or clusters of fused or agglomerated silicon nanoparticles 301 with a nanoparticle passivation film 306. The nanoparticle passivation film 306 may comprise silicon dioxide, silicon nitride, or other suitable passivation material formed on the surface of individual or clusters of silicon nanoparticles 301. For example, the nanoparticle passivation film 306 may comprise an oxide thermally grown on the surface of the silicon nanoparticles 301 by heating the silicon nanoparticles 301 in an oxidizing environment. Depending on the porosity of the silicon nanoparticles 301, the nanoparticle passivation film 306 may also be deposited on the surface of the silicon nanoparticles 301 by CVD, including by ALD. For example, the nanoparticle passivation film 306 may comprise silicon nitride deposited on the surface of the silicon nanoparticles 301 by ALD.

Figure 10:
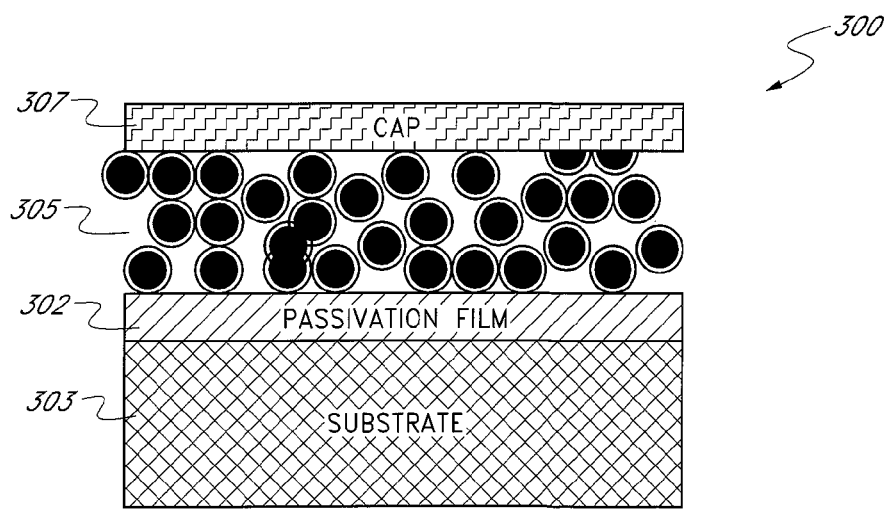

In FIG. 10, a cap layer 307 is formed on the passivated silicon nanoparticles 305. The cap layer 307 may comprise deposited silicon nitride or other capping material. The cap layer 307 prevents moisture from seeping into underlying materials, possibly degrading the interface of the passivated silicon nanoparticles 305 and the passivation film 302. The cap layer 307 is optional and may be omitted in some processes.

Figure 11:
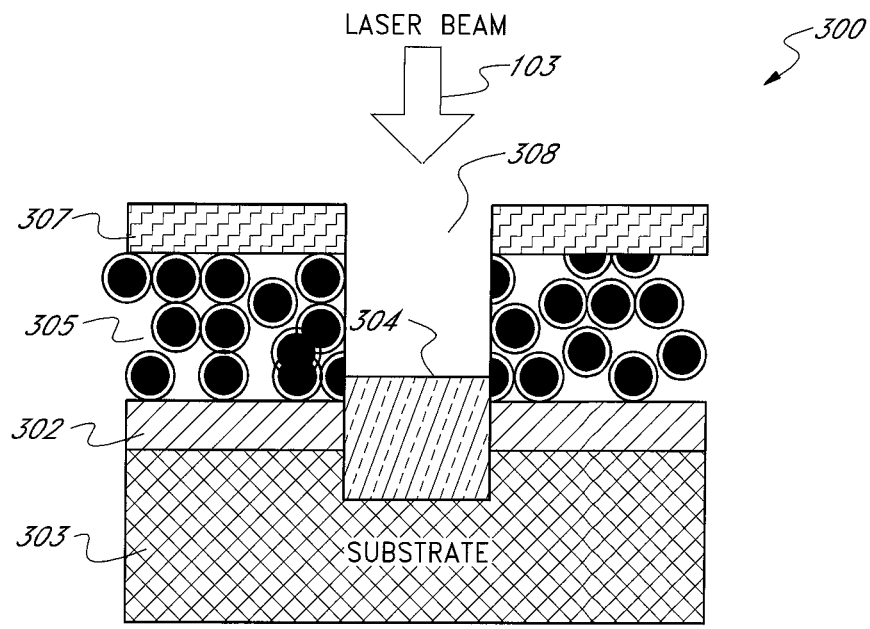

In FIG. 11, a laser contact process impinges the laser beam 103 on areas over the substrate 303 where the emitter 304 is formed. The laser contact process removes portions of the cap layer 307, melts the passivated silicon nanoparticles 305, and removes portions of the passivation film 302 to form the contact hole 308 and the emitter 304. In general, the laser contact process may involve one or more laser sources, one or more laser pulses, one or more laser steps, and may include laser processes other than melting. In one embodiment, the melting of the passivated silicon nanoparticles 305 is by laser melting, while the removal of the portions of the cap layer 307 and the removal of the portions of the passivation film 302 are by laser ablation. The bulk of the emitter 304 comprises the melted silicon nanoparticles 301, which are doped and are thus conductive.

The solar cell 300 includes a plurality of emitters 304 with different conductivity types but only one is shown in FIG. 11 and subsequent figures for clarity of illustration. The emitter 304 may have P-type conductivity, in which case the silicon nanoparticles 301 comprise P-type dopants. Alternatively, the emitter 304 may have N-type conductivity, in which case the silicon nanoparticles 301 comprise N-type dopants. In general, silicon nanoparticles 301 with P-type dopants are formed over regions of the substrate 303 where P-type emitters are formed, and silicon nanoparticles 301 with N-type dopants are formed over regions of the substrate 303 where N-type emitters are formed. The laser melting process melts the silicon nanoparticles 301 to form emitters 304 with corresponding conductivity type.

In the case of laser melting, the thickness of the nanoparticle passivation film 306 may cover a wide range relative to the particle size of the silicon nanoparticles 301, but is generally going to be thinner compared to, for example, a laser ablation process. The laser source 102 is selected with optimal power, wavelength, and pulse time to achieve nanoparticle melting. These laser characteristics may differ from those in the case of bulk silicon because of the size dependence of physical properties for nanoparticles, including optical and thermal behavior. The laser beam 103 of the laser source 102 may be directed onto the area where the contact hole 308 and the emitter 304 are to be formed. That area may be any size less than or equal to the area covered by the passivated silicon nanoparticles 305. The individual nanoparticle passivation film 306 is relatively thin to allow for rupture of the nanoparticle passivation film 306 during the laser melting such that the melted silicon nanoparticles 301 are not confined to individual shells created by the nanoparticle passivation film 306. The rupture of the nanoparticle passivation film could be caused by various interactions of the nanoparticle passivation film, the nanoparticle and the laser process, such as indirect ablation or melting of the nanoparticle passivation film.

Upon laser melting, the silicon nanoparticles 301 will melt and recrystallize to form either a polysilicon layer or an epitaxial silicon layer. The regrown layer, which is highly doped polysilicon or monocrystalline silicon serves as the emitter 304. This regrown area of the emitter 304 may reside within an area of crystalline silicon with the bulk substrate doping or within an area of higher doping than the substrate due to dopant drive from the silicon nanoparticles 301 to form the emitter 304. Depending on the specific film stack in place for the laser melting, the stack may ablate during the laser melting of the silicon nanoparticles 301, or a second laser condition may be required to ablate the film stack either before or after the laser melting of the silicon nanoparticles 301. This results in the contact hole 308 to the surface of the annealed region, which is conductive and formed only in the area of the silicon nanoparticles 301 exposed to the laser beam 103. The rest of the silicon nanoparticles 301, i.e., those not exposed to the laser beam 103, have a higher resistivity and will not conduct carriers or contribute significantly to carrier recombination.

As before, the thickness of the nanoparticle passivation film 306 relative to the particle size of the silicon nanoparticles 301 may be tailored for a particular laser source 102. That is, the thickness of the nanoparticle passivation film 306 may be adjusted for optimum melting. The thickness of the nanoparticle passivation film 306, the size of the silicon nanoparticles 301, and the characteristics of the laser source 102 will depend on the particulars of the solar cell.

Figure 12:
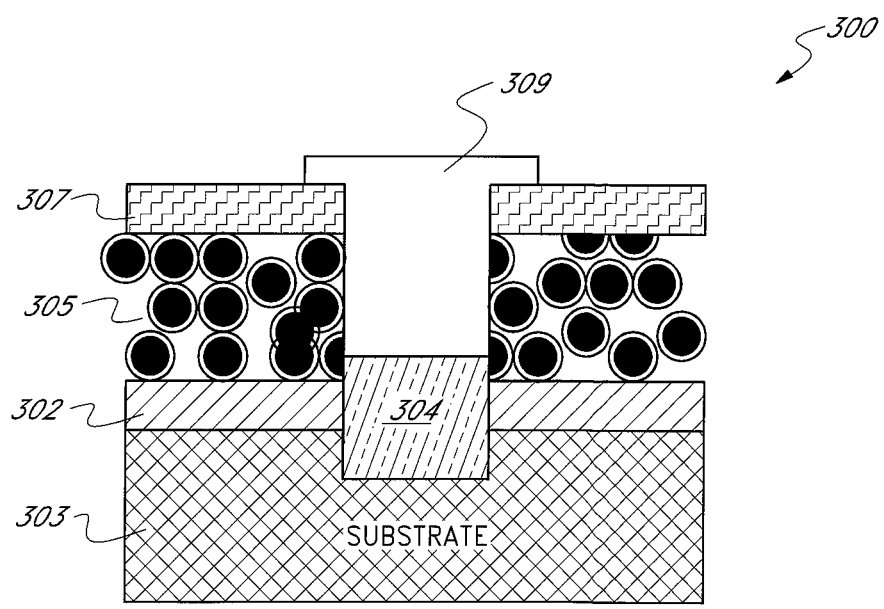

In FIG. 12, a metal contact 309 is formed in each contact hole 308 to electrically connect to the surface of a corresponding emitter 304.

Figure 13:
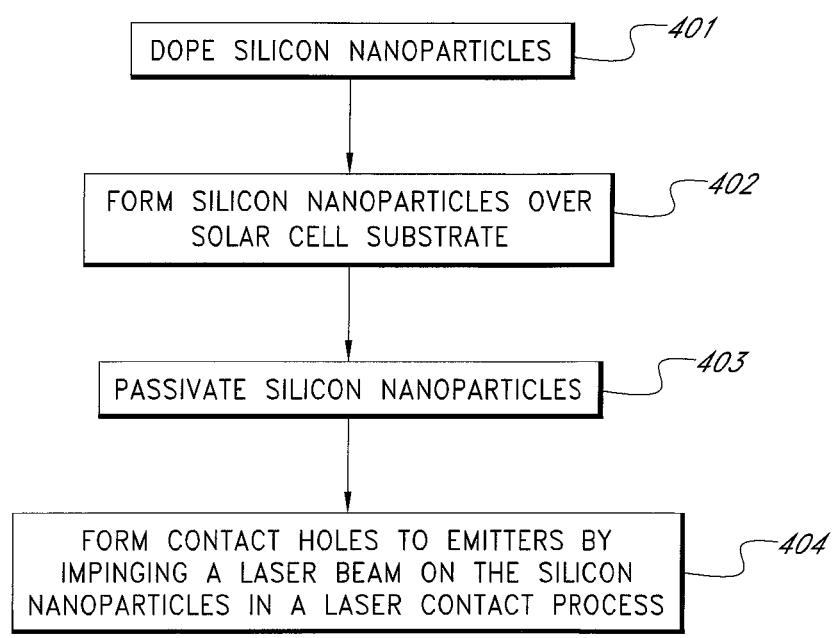
FIG. 13 shows a flow diagram of a method of forming contact holes of solar cells using a laser contact process in accordance with an embodiment of the present invention.

FIG. 13 shows a flow diagram of a method of forming contact holes of solar cells using a laser contact process in accordance with an embodiment of the present invention. In the example of FIG. 13, silicon nanoparticles are doped with appropriate dopants, such as N-type dopants to form contact holes to N-type emitters or P-type dopants to form contact holes to P-type emitters (step 401). The silicon nanoparticles are formed over a solar cell substrate (step 402). For example, the silicon nanoparticles may be deposited directly on the solar cell substrate or on another layer (e.g., a passivation film) that is on the substrate.

The silicon nanoparticles are passivated (step 403). The silicon nanoparticles may be passivated during synthesis, after synthesis but before formation on the solar cell substrate, or after formation on the solar cell substrate. The silicon nanoparticles may be passivated on the solar cell substrate before or after forming the emitters of the solar cell. The silicon nanoparticles may be passivated by coating the surface of individual or clusters of silicon nanoparticles with a nanoparticle passivation film. As a particular example, oxide may be thermally grown on the surface of individual or clusters of silicon nanoparticles. As another example, silicon nitride may be deposited on the surface of individual or clusters of silicon nanoparticles. Advantageously, the thickness of the nanoparticle passivation film may be tailored for particular laser sources to meet the needs of particular laser contact processes.

Contact holes are formed to emitters of the solar cell by impinging a laser beam on the silicon nanoparticles in a laser contact process (step 404). For example, the laser contact process may comprise a laser ablation process to form a contact hole through the silicon nanoparticles, and other or the same ablation process to form the contact hole through other materials. In that case, the emitters may be formed by diffusing dopants from the silicon nanoparticles into the solar cell substrate prior to forming the contact holes that expose the emitters. As another example, the laser contact process may comprise a laser melting process whereby the silicon nanoparticles are melted to form contact holes to emitters comprising the melted silicon nanoparticles. The contact holes may be formed though a cap layer, the silicon nanoparticles, and a passivation film. The contact holes through materials other than the silicon nanoparticles may be by laser ablation or other laser process; the contact holes through the silicon nanoparticles may be by laser melting. The use of a laser allows for relatively small point contact holes through silicon nanoparticles for increased solar cell efficiency.

As can be appreciated from the foregoing, embodiments of the present invention may be performed using a variety of lasers, silicon nanoparticle sizes, and nanoparticle passivation film thicknesses to meet particular process requirements. For example, for both laser ablation and laser melting, a green or infrared (or other wavelength) laser with a 1 fs to 10 ns pulse width may be employed. The thickness of the nanoparticle passivation film will depend on the size of the silicon nanoparticles and the type of laser process, i.e., either ablation or melting. Generally speaking, nanoparticle passivation films that have a thickness greater than 25% of the diameter of the silicon nanoparticles tend to go into laser ablation, and nanoparticle passivation films having a thickness equal to or less than 25% of the diameter of the silicon nanoparticles tend to go into laser melting. For example, a 200 nm diameter silicon nanoparticle coated with 10 nm thick nanoparticle passivation film is more suited for laser melting. As another example, a 15 nm diameter silicon nanoparticle with 10 nm thick nanoparticle passivation film is more suited for laser ablation.

Laser contact processes, laser system, and solar cell structures for fabricating solar cells using silicon nanoparticles have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:
1. A solar cell comprising:
   a solar cell substrate;
   a plurality of silicon nanoparticles over the solar cell substrate, the plurality of silicon nanoparticles being coated with nanoparticle passivation film;

an emitter; and a metal contact that electrically connects to the emitter through a contact hole formed in the plurality of silicon nanoparticles.

2. The solar cell of claim 1, wherein the emitter comprises polysilicon.

3. The solar cell of claim 1, wherein the emitter comprises monocrystalline silicon.

4. The solar cell of claim 1, further comprising a cap layer formed over the plurality of silicon nanoparticles, and wherein the metal contact electrically connects to the emitter through the contact hole formed in the cap layer and in the plurality of silicon nanoparticles.

5. The solar cell of claim 1, wherein the nanoparticle passivation film comprises silicon nitride.

6. The solar cell of claim 1, further comprising a passivation film between the solar cell substrate and the plurality of silicon nanoparticles.

7. The solar cell of claim 6, wherein the passivation film comprises silicon dioxide.

8. The solar cell of claim 1, wherein the emitter is in the solar cell substrate.

9. The solar cell of claim 1, wherein the nanoparticle passivation film is on individual silicon nanoparticles in the plurality of silicon nanoparticles.

10. The solar cell of claim 1, wherein the nanoparticle passivation film is on clusters of silicon nanoparticles in the plurality of silicon nanoparticles.

11. The solar cell of claim 1, wherein the solar cell substrate comprises a silicon substrate.

12. A solar cell comprising:
a solar cell substrate;
a plurality of silicon nanoparticles over the solar cell substrate, the plurality of silicon nanoparticles being coated with a nanoparticle passivation film;
an emitter between silicon nanoparticles in the plurality of silicon nanoparticles; and
a metal contact that electrically connects to the emitter.

13. The solar cell of claim 12, wherein the solar cell substrate comprises a silicon substrate.

14. The solar cell of claim 12, further comprising a passivation film between the solar cell substrate and the plurality of silicon nanoparticles.

15. The solar cell of claim 12, further comprising a cap layer over the plurality of silicon nanoparticles.

16. A solar cell comprising:
a solar cell substrate;
a plurality of silicon nanoparticles over the solar cell substrate, a surface of an individual silicon nanoparticle or a cluster of silicon nanoparticles in the plurality of silicon nanoparticles having a nanoparticle passivation film;
an emitter; and
a metal contact that electrically connects to the emitter.

17. The solar cell of claim 16, wherein the plurality of silicon nanoparticles is over the emitter.

18. The solar cell of claim 16, wherein the emitter is between silicon nanoparticles in the plurality of silicon nanoparticles.

19. The solar cell of claim 16, further comprising a cap layer over the plurality of silicon nanoparticles.

20. The solar cell of claim 16, wherein the emitter comprises polysilicon.

* * * * *